(12) United States Patent
Davidson

(10) Patent No.: US 9,813,054 B2
(45) Date of Patent: Nov. 7, 2017

(54) SEMICONDUCTOR SWITCHING STRING

(71) Applicant: General Electric Technology GmbH, Baden (CH)

(72) Inventor: Colin Charnock Davidson, Staffordshire (GB)

(73) Assignee: GENERAL ELECTRIC TECHNOLOGY GMBH (CH)

(*) Notice: Subject to any disclaimer, the term of this patent is extended or adjusted under 35 U.S.C. 154(b) by 0 days.

(21) Appl. No.: 14/898,095

(22) PCT Filed: Jun. 10, 2014

(86) PCT No.: PCT/EP2014/062049
§ 371 (c)(1),
(2) Date: Dec. 11, 2015

(87) PCT Pub. No.: WO2014/198734
PCT Pub. Date: Dec. 18, 2014

(65) Prior Publication Data
US 2016/0118907 A1  Apr. 28, 2016

(30) Foreign Application Priority Data
Jun. 14, 2013  (EP) .................................. 13172036

(51) Int. Cl.
*H02M 5/458* (2006.01)
*H03K 17/16* (2006.01)
(Continued)

(52) U.S. Cl.
CPC ............ *H03K 17/161* (2013.01); *H02M 5/45* (2013.01); *H02M 5/458* (2013.01); *H02M 7/68* (2013.01);
(Continued)

(58) Field of Classification Search
CPC ...... H02M 1/4216; H02M 5/45; H02M 5/458; H02M 1/08; H03K 17/161
(Continued)

(56) References Cited

U.S. PATENT DOCUMENTS 4,161,022 A * 7/1979 Kanazawa ............ H02M 1/083
219/661
4,482,946 A * 11/1984 Bhagwat ............. H02M 7/5152
363/136
(Continued)

FOREIGN PATENT DOCUMENTS

EP  2 955 837 A1  12/2015
EP  2 955 838 A1  12/2015
(Continued)

OTHER PUBLICATIONS

International Search Report and Written Opinion, PCT/EP2014/062049, Alstom Technology Ltd, 7 pages (dated Sep. 30, 2014).
(Continued)

*Primary Examiner* — Rajnikant Patel
(74) *Attorney, Agent, or Firm* — GE Global Patent Operation; Scott R. Stanley

(57) ABSTRACT

A semiconductor switching string includes a plurality of series-connected semiconductor switching assemblies, each having a main semiconductor switching element that includes first and second connection terminals. The main semiconductor switching element also has an auxiliary semiconductor switching element electrically connected between the first and second connection terminals. Each semiconductor switching assembly also includes a control unit configured to switch on a respective auxiliary semiconductor switching element to selectively create an alternative current path between the first and second connection terminals whereby current is diverted to flow through the alternative current path to reduce the voltage across the corresponding
(Continued)

main semiconductor switching element. The or each control unit is further configured to switch on the auxiliary semiconductor switching element when the voltage across the corresponding main semiconductor switching element differs from a voltage reference derived from the voltage across all of the main semiconductor switching elements.

12 Claims, 4 Drawing Sheets

(51) Int. Cl.
| | |
|---|---|
| H03K 17/0814 | (2006.01) |
| H03K 17/10 | (2006.01) |
| H02M 5/45 | (2006.01) |
| H02M 7/68 | (2006.01) |
| H03K 17/66 | (2006.01) |
| H03K 17/687 | (2006.01) |

(52) U.S. Cl.
CPC ..... *H03K 17/08144* (2013.01); *H03K 17/105* (2013.01); *H03K 17/16* (2013.01); *H03K 17/66* (2013.01); *H03K 17/687* (2013.01)

(58) Field of Classification Search
USPC .......... 363/16–17, 37, 45, 49, 54, 56.01, 65, 363/125–132; 361/18, 141; 323/224, 323/225, 235, 266
See application file for complete search history.

(56) References Cited

U.S. PATENT DOCUMENTS

| | | | |
|---|---|---|---|
| 4,500,934 A | 2/1985 | Kinsinger | |
| 4,642,476 A | 2/1987 | Honig | |
| 4,697,129 A | 9/1987 | Enami et al. | |
| 4,697,219 A | 9/1987 | Mitsuoka | |
| 4,811,190 A | 3/1989 | Keir et al. | |
| 4,878,010 A | 10/1989 | Weber | |
| 5,463,344 A | 10/1995 | Temple | |
| 5,473,526 A | 12/1995 | Svensson et al. | |
| 5,570,057 A | 10/1996 | Palara | |
| 5,923,513 A | 7/1999 | Pelly | |
| 6,434,029 B1* | 8/2002 | Cyr | H02M 1/34 323/222 |
| 6,639,767 B2 | 10/2003 | Ito et al. | |
| 6,927,556 B2* | 8/2005 | Hosotani | H02M 1/4208 323/222 |
| 8,305,777 B2* | 11/2012 | Rittiger | H02J 3/36 363/35 |
| 8,711,591 B2* | 4/2014 | Jonsson | H02M 7/758 363/84 |
| 8,737,096 B2* | 5/2014 | Asplund | H02J 3/36 363/35 |
| 8,867,242 B2* | 10/2014 | Clare | H02J 3/36 363/35 |
| 2002/0057540 A1* | 5/2002 | Ito | H02M 1/08 361/18 |
| 2008/0074816 A1 | 3/2008 | Omaru | |

FOREIGN PATENT DOCUMENTS

| | | |
|---|---|---|
| JP | 08-195664 A | 7/1996 |
| JP | H08-195664 A | 7/1996 |
| WO | WO-2010/097113 A1 | 9/2010 |
| WO | WO-2011/042596 A1 | 4/2011 |
| WO | WO-2014/198730 A1 | 12/2014 |
| WO | WO-2015/189214 A1 | 12/2015 |
| WO | WO-2015/189215 A1 | 12/2015 |

OTHER PUBLICATIONS

International Preliminary Report on Patentability, PCT/EP2014/062049, Alstom Technology Ltd, 6 pages (dated Sep. 22, 2015).
Written Opinion of the International Preliminary Examining Authority, PCT/EP2014/062049, Alstom Technology Ltd, 6 pages (dated May 13, 2015).
English-language machine translation of JP H08-195664, Fuji Electric Co. Ltd. (dated Jul. 30, 1996).
Notice of Allowance issued in connection with related U.S. Appl. No. 14/898,098, filed Jul. 26, 2017.

* cited by examiner

SEMICONDUCTOR SWITCHING STRING

CROSS REFERENCE TO RELATED APPLICATIONS

The present application is a National Stage of International Application No. PCT/EP2014/062049, filed Jun. 10, 2014, which claims priority to European Application No. 13172036, filed Jun. 14, 2013, which is incorporated herein by reference in its entirety.

This invention relates to a semiconductor switching string for use in a high voltage direct current (HVDC) power converter.

In power transmission networks alternating current (AC) power is typically converted to direct current (DC) power for transmission via overhead lines and/or under-sea cables. This conversion removes the need to compensate for the AC capacitive load effects imposed by the transmission line or cable and reduces the cost per kilometre of the lines and/or cables, and thus becomes cost-effective when power needs to be transmitted over a long distance.

HVDC power converters are used to convert AC power to DC power. Semiconductor switching elements, such as thyristors, are a key component of HVDC power converters, and act as controlled rectifiers to convert AC power to DC power and vice versa.

While such semiconductor switching elements have very high breakdown voltages and are capable of carrying high current loads, even semiconductor switching elements from the same batch exhibit different performance characteristics. This creates difficulties in the operation of, e.g. a HVDC power converter in which the semiconductor switching elements are incorporated.

In addition, many semiconductor switching elements have inherent limitations in their performance which require the inclusion of large, heavy and difficult-to-design remedial components within, e.g. a HVDC power converter, to compensate for these shortcomings.

There is, therefore, a need for an improved semiconductor switching assembly which obviates one or more of the difficulties outlined above.

According to a first aspect of the invention there is provided a semiconductor switching string, for use in a HVDC power converter, comprising:

a plurality of series-connected semiconductor switching assemblies, each semiconductor switching assembly having a main semiconductor switching element including first and second connection terminals between which current flows from the first terminal to the second terminal when the main semiconductor switching element is switched on, the main semiconductor switching element having an auxiliary semiconductor switching element electrically connected between the first and second connection terminals thereof; and a control unit operatively connected with each auxiliary semiconductor switching element, the or each control unit being configured to switch on a respective auxiliary semiconductor switching element to selectively create an alternative current path between the first and second connection terminals associated therewith whereby current is diverted to flow through the alternative current path to reduce the voltage across the corresponding main semiconductor switching element, and the or each control unit being further configured to switch on the said respective auxiliary semiconductor switching element when the voltage across the corresponding main semiconductor switching element differs from a voltage reference derived from the voltage across all of the main semiconductor switching elements in the semiconductor switching string.

The inclusion of a control unit which is configured to switch on a respective auxiliary semiconductor switching element to selectively create an alternative current path between the first and second connection terminals of a corresponding main semiconductor switching element, whereby current is diverted through the alternative current path to reduce the voltage across the corresponding main semiconductor switching element, allows the semiconductor switching string of the invention to compensate for a variation in the turn-off performance characteristic of the various main semiconductor switching elements in the string of series-connected main semiconductor switching elements. As such the semiconductor switching string of the invention permits the mix and match of semiconductor switching elements, e.g. thyristors, from not just different batches but from different suppliers. Furthermore, the switching string of the invention drastically reduces the size of an associated remedial component, e.g. a damping circuit, that is otherwise required to compensate for the aforementioned variation in the turn-off performance characteristic of a series of semiconductor switching elements.

In addition, having a control unit which is additionally configured to switch on a respective auxiliary semiconductor switching element when the voltage across the corresponding main semiconductor switching element differs from a voltage reference provides a degree of feedback control via which the aforementioned compensation for variations in the turn-off characteristics of the various main semiconductor switching elements can be carried out automatically.

Preferably the voltage reference is equivalent to the average voltage across all of the main semiconductor switching elements in the semiconductor switching string.

Such a reference voltage can be readily computed, e.g. by a higher level controller which receives from the or each control unit a local measurement of the voltage across the corresponding main semiconductor switching element.

Optionally the or each control unit is configured to switch on a said respective auxiliary semiconductor switching element when the voltage across the corresponding main semiconductor switching element is greater than the voltage reference.

A control unit so configured has the effect of reducing the voltage across the or each main semiconductor switching element with a voltage above the voltage reference, i.e. above the average voltage across all of the main semiconductor switching elements, such that the average voltage across the remaining main semiconductor switching elements increases and in due course the voltage across all of the main semiconductor switching elements becomes essentially equally balanced across each individual main semiconductor switching element.

The or each control unit may be configured to control the amount of current diverted to flow through a respective alternative current path so that the voltage across the corresponding main semiconductor switching element approaches the voltage reference.

Such an arrangement desirably helps to ensure that each of the various main semiconductor switching elements has a uniform voltage thereacross, which most preferably is essentially equal to the voltage across each of the other main semiconductor switching elements.

In a preferred embodiment of the invention the or each control unit is configured to control the amount of current diverted to flow through a respective alternative current path by selectively switching the corresponding auxiliary semiconductor switching element on and off.

Such control is desirable so as not to create a further problem while attempting to alleviate the difficulties associated with differing turn-off performance characteristics between main semiconductor switching elements.

In another preferred embodiment of the invention the or each control unit is further configured to switch the said corresponding auxiliary semiconductor switching element on and off within a switching operation a plurality of times in an operating cycle of the semiconductor switching string.

Carrying out an on/off switching operation a plurality of times within a given operating cycle of the semiconductor switching string, i.e. while each of the main semiconductor switching elements within the string is in either a reverse-biased or a forward-biased condition, helps to ensure that the level of current flowing through a respective alternative current path, and hence the level of current flowing through the corresponding auxiliary semiconductor switching element, remains at a level required to compensate for the aforementioned variation in turn-off performance characteristics.

Optionally the ratio of time for which a said corresponding auxiliary semiconductor switching element is on and off within a switching operation differs during the operating cycle.

Such a switching regime allows the semiconductor switching string of the invention to adapt to a change in, e.g. the stored charge remaining in a given main semiconductor switching element.

Preferably each semiconductor switching assembly includes an auxiliary semiconductor switching element connected in inverse-parallel with the corresponding main semiconductor switching element whereby when the inverse-parallel connected auxiliary semiconductor switching element is switched on the alternative current path is configured to allow current to flow from the second connection terminal to the first connection terminal of the corresponding main semiconductor switching element, and wherein the corresponding control unit is configured to switch on a respective inverse-parallel connected auxiliary semiconductor switching element while the corresponding main semiconductor switching element is in a reverse-biased condition to divert current to flow through the so-configured alternative current path to reduce the voltage across the corresponding main semiconductor switching element.

Having each auxiliary semiconductor switching element arranged in such a manner, and the corresponding control unit configured in such a manner, allows the semiconductor switching string of the invention to compensate for the greatest impact of a variation in the turn-off performance characteristics of a string of series-connected main semiconductor switching elements, namely the resulting variation in reverse recovered charge stored by each main semiconductor switching element which arises when the main semiconductor switching elements continue to conduct current for differing periods of time when in the reverse-biased condition after forward conduction has ceased.

Each inverse-parallel connected auxiliary semiconductor switching element may be or include a transistor having an emitter connected to the first connection terminal of the corresponding main semiconductor switching element, a collector connected to the second connection terminal of the corresponding main semiconductor switching element, and a base connected to the corresponding control unit.

A transistor, especially one incorporating a wide-band-gap semiconducting material such as silicon carbide, gallium nitride or diamond, has the required high voltage performance characteristic necessary to match or even exceed that of the corresponding main semiconductor switching element, while at the same time permitting the passage therethrough of a relatively small amount of current necessary to affect the desired reduction in voltage across the corresponding main semiconductor switching element.

In a still further preferred embodiment of the invention each semiconductor switching assembly includes an auxiliary semiconductor switching element connected in parallel with the corresponding main semiconductor switching element whereby when the parallel connected auxiliary semiconductor switching element is switched on the alternative current path is configured to allow current to flow from the first connection terminal to the second connection terminal of the corresponding main semiconductor switching element, and wherein the corresponding control unit is configured to switch on a respective parallel connected auxiliary semiconductor switching element while the corresponding main semiconductor switching element is in a forward-biased condition to divert current to flow through the so-configured alternative current path.

Such an arrangement desirably allows the semiconductor switching string of the invention to compensate for different performance characteristics of respective main semiconductor switching elements and inherent limitations in their performance which are manifest when the main semiconductor switching elements are in the forward-biased condition, i.e. each main semiconductor switching element is switched off but experiences a positive voltage between its first and second connection terminals such that it will allow current to flow therethrough on receipt of a turn-on signal from the corresponding control unit.

Optionally each parallel connected auxiliary semiconductor switching element is or includes a transistor having an emitter connected to the second connection terminal of the corresponding main semiconductor switching element, a collector connected to the first connection terminal of the corresponding main semiconductor switching element, and a base connected to the corresponding control unit.

As mentioned above, transistors, especially those incorporating wide-band-gap to semiconducting materials, have desirable high voltage performance characteristics.

In another embodiment of the invention each semiconductor switching assembly includes a first auxiliary semiconductor switching element connected in inverse-parallel with the corresponding main semiconductor switching element and a second auxiliary semiconductor switching element connected in parallel with the corresponding main semiconductor switching element.

Such an arrangement provides each semiconductor switching assembly with bi-directional functionality whereby it is able to selectively reduce the voltage across a corresponding main semiconductor switching element when the said main semiconductor switching element is either reverse-biased or forward-biased so as to permit grading, i.e. balancing of the respective voltages across the various main semiconductor switching elements, when the various main semiconductor switching elements are in either such biased conditions.

Optionally each semiconductor switching assembly includes an auxiliary semiconductor switching element selectively connectable in inverse-parallel and in parallel with the corresponding main semiconductor switching element whereby when the auxiliary semiconductor switching element is connected in inverse-parallel and switched on a first alternative current path allows current to flow from the second connection terminal to the first connection terminal of the corresponding main semiconductor switching element, and whereby when the auxiliary semiconductor switching element is connected in parallel and switched on a second alternative current path allows current to flow from the first connection terminal to the second connection terminal of the corresponding main semiconductor switching element.

The inclusion in each semiconductor switching assembly of an auxiliary semiconductor switching element which is selectively connectable in both inverse-parallel and parallel with the corresponding main semiconductor switching element provides the ability to grade the voltages across the main semiconductor switching elements when they are either reverse-biased or forward-biased using only one auxiliary semiconductor switching element.

Each auxiliary semiconductor switching element may be connected with first and second pairs of passive current check elements in a full bridge arrangement between the first and second connection terminals of the corresponding main semiconductor switching element.

Such an arrangement permits current to flow through a respective auxiliary semiconductor switching element when flowing both from the second connection terminal of the corresponding main auxiliary switching element to the first connection terminal thereof and vice versa.

There now follows a brief description of preferred embodiments of the invention, by way of non-limiting example, with reference to the accompanying drawings in which:

FIG. 2(a) illustrates how a difference in the turn-off performance characteristics of respective main semiconductor switching elements in each of the semiconductor switching assemblies shown in FIG. 1(b) is compensated for;

Figure 1A:
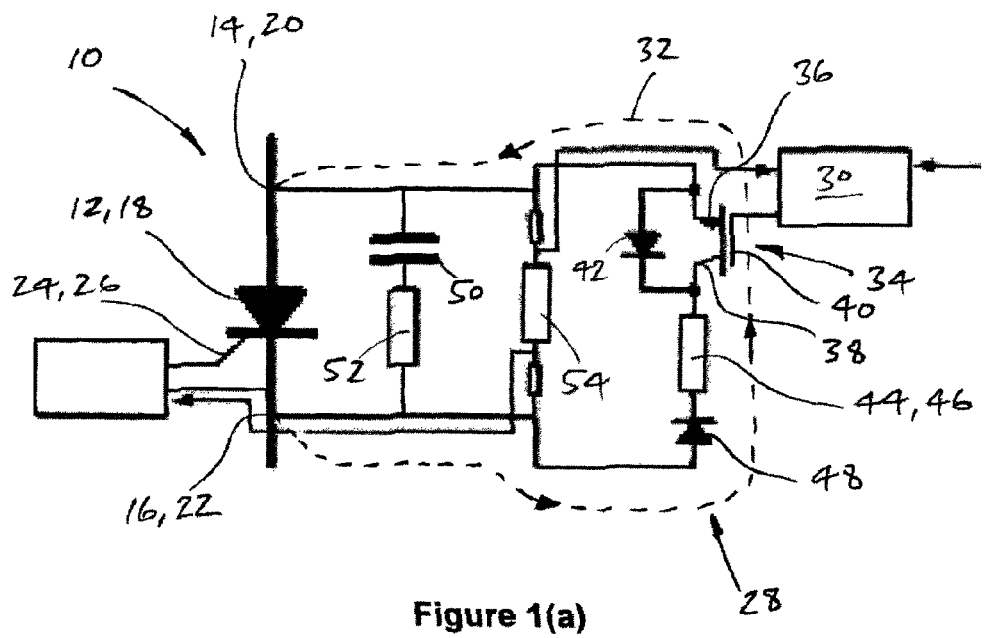
FIG. 1(a) shows a schematic view of a first semiconductor switching assembly which forms a part of a semiconductor switching string according to a first embodiment of the invention.

The first semiconductor switching assembly 10 includes a main semiconductor switching element 12 which has first and second connection terminals 14, 16. In the embodiment shown the main semiconductor switching element 12 is a main thyristor 18, although in other embodiments of the invention a different semiconductor switching element may be used such as a diode, Light-Triggered Thyristor (LTT), Gate Turn-Off thyristor (GTO), Gate Commutated Thyristor (GCT) or Integrated Gate Commutated Thyristor (IGCT). Preferably the main semiconductor switching element 12 is optimised for lowest conduction (on-state) losses at the expense of other parameters such as turn-on and turn-off characteristics and off-state dv/dt capability.

The main thyristor 18 shown includes an anode 20 which defines the first connection terminal 14, a cathode 22 which defines the second connection terminal 16, and a gate 24 that defines a control terminal 26 via which the main thyristor 18 may be switched on.

When the main thyristor 18 is so switched on, i.e. turned-on fully, current flows through the main thyristor 18 from the first connection terminal 14 to the second connection terminal 16, i.e. from the anode 20 to the cathode 22.

The main thyristor 18 has an auxiliary semiconductor switching element 28 which is electrically connected between the first and second connection terminals 14, 16 of the main thyristor 18, and the auxiliary semiconductor switching element 28 has a control unit 30 that is operatively connected therewith. The control unit 30 is configured to switch on the auxiliary semiconductor switching element 28 to selectively create an alternative current path 32 between the first and second connection terminals 14, 16.

More particularly the auxiliary semiconductor switching element 28 is connected in inverse-parallel with the main thyristor 18 such that when the auxiliary semiconductor switching element is switched on the resulting alternative current path 32 is configured to allow current to flow from the second connection terminal 16 to the first connection terminal 14.

More particularly still the auxiliary semiconductor switching element 28 includes a transistor 34 which has an emitter 36 that is connected to the first connection terminal 14 of the main thyristor 18, a collector 38 that is connected to the second connection terminal 16 of the main thyristor 18, and a base 40 that is connected to the control unit 30.

The transistor 34 shown in FIG. 1 is an n-channel insulated-gate bipolar transistor (IGBT), although many other transistors may also be used such as, for example, a bipolar junction transistor (BJT), a metal-oxide-semiconductor field-effect transistor (MOSFET), or a junction gate field-effect transistor (JFET). A transistor assembly, such as a MOSFET-JFET cascode circuit incorporating a super-cascode arrangement of 50V MOSFETs and a series string of 1200V SiC JFETs, or a direct series connection of low voltage MOSFETs or IGBTs, may also be used. In any event the transistor 34 shown has a relatively high voltage rating of approximately 9 kV to 10 kV, but a relatively low current rating of only a few tens of amps.

In the embodiment shown the transistor 34 has an anti-parallel diode 42 connected thereacross which protects the transistor 34 from reverse voltages while the main thyristor 18 is forward-biased. In other embodiments of the invention (not shown) the separate anti-parallel diode 42 could be omitted and instead use made of an intrinsic body-diode which is included within some transistors.

The auxiliary semiconductor switching element 28 shown in FIG. 1(a) also includes an optional current limiting element 44, in the form of a resistor 46, which is connected in series with the transistor 34 and anti-parallel diode 42 combination mentioned above. The auxiliary semiconductor switching element 28 also additionally includes a further, series-connected diode 48 which is arranged to permit the flow of current through the alternative current path 32 in the same direction as through the transistor 34. The further, series-connected diode 48 is included, in conjunction with the anti-parallel diode 42, to protect the transistor 34 from reverse voltages while the main thyristor 18 is forward-biased.

In other embodiments of the invention in which the auxiliary semiconductor switching element 28, i.e. the transistor 34, is capable of withstanding reverse voltage (while the main semiconductor switching element 12, i.e. the main thyristor 18, is forward-biased) the anti-parallel diode 42 and the series-connected diode 48 may be omitted.

As well as having the auxiliary semiconductor switching element 28 connected in inverse-parallel therewith, the main thyristor 18 also has a damping circuit (which includes a damping capacitor 50 and a damping resistor 52), as well as a further resistor 54, i.e. a DC grading resistor, connected in parallel between the first and second connection terminals 14, 16.

In use an ideal thyristor would cease to conduct exactly at the instant when the current flowing through the thyristor falls to zero. However a real thyristor, such as the main thyristor 18 shown in FIG. 1, continues to conduct current in a reverse direction (even when the main thyristor 18 is switched off and in a so-called reverse-biased condition) for some hundreds of microseconds after the current falls to zero, as illustrated schematically in FIG. 2($a$). The time integral of this reverse current is the 'reverse recovered charge' ($Q_r$), i.e. stored charge, of the main thyristor 18.

In the embodiment shown, the main thyristor 18 has a lower $Q_{rr}$ than, e.g. a second main thyristor 56 in an otherwise identical further first semiconductor switching assembly 10 which is connected in series with the first semiconductor switching assembly 10 that includes the first main thyristor 18, as shown in FIG. 1($b$).

In this way the two first semiconductor switching assemblies 10 together define a portion of the semiconductor switching string 100 according to the first embodiment of the invention, which additionally includes further series-connected first semiconductor switching assemblies 10 (not shown). The two semiconductor switching assemblies 10 shown each has its own corresponding control unit 30. In other embodiments, however, one or more such semiconductor switching assemblies 10 within a given semiconductor switching string may share a common control unit.

Figure 2A:
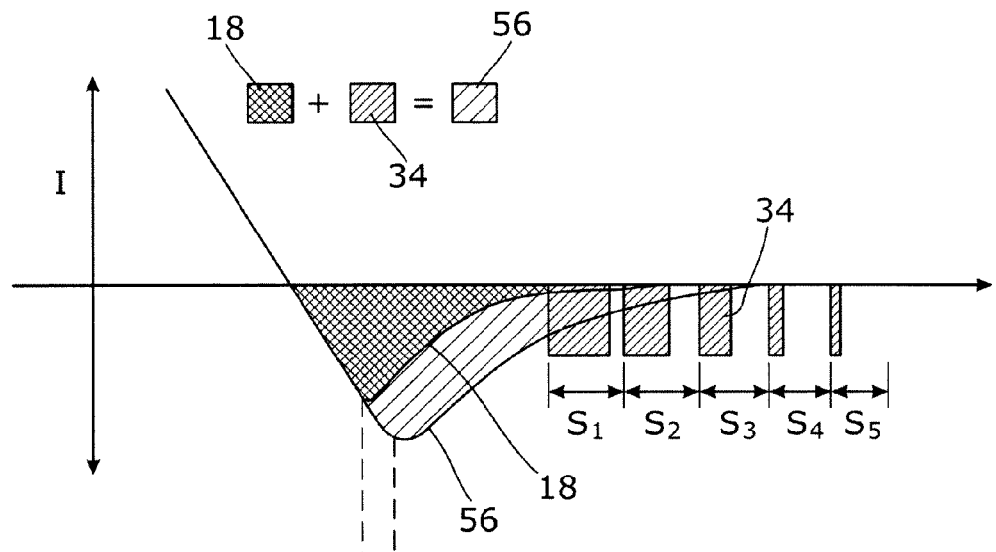
Figure 2B:
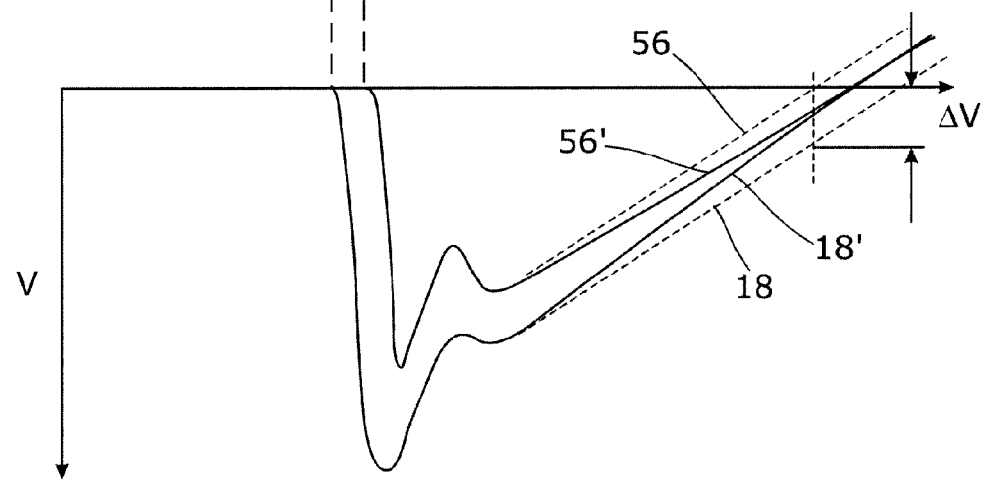
FIG. 2(b) illustrates the resulting change in voltage across each of the main semiconductor switching elements as the compensation shown in FIG. 2(a) takes place.

Meanwhile, the aforementioned difference in Q, between the first and second main thyristors 18, 56 arises because the first main thyristor 18 starts to turn off sooner than the second main thyristor 56. As a result the reverse current flowing though the first main thyristor 18 will start to reduce sooner than in the second main thyristor 56, as also shown in FIG. 2($a$).

When the first and second main thyristors 18, 56 are connected in the series arrangement shown in FIG. 1($b$), i.e. as a portion of the first semiconductor switching string 100, the current flowing through the first semiconductor switching assembly 10 (i.e. the switching assembly including the first main thyristor 18) must be the same as the current flowing through the further first semiconductor switching assembly 10 (i.e. the switching assembly including the second main thyristor 56). Since the first main thyristor 18 turns off sooner (and so no longer conducts current) the difference in reverse current flows into the damping circuit, i.e. the damping capacitor 50 and the damping resistor 52, of the first main thyristor 18. This causes the voltage V across the first main thyristor 18 to build up sooner, and reach a larger reverse peak voltage (as shown by a first dashed line 18 in FIG. 2($b$)), than the second main thyristor 56 with a higher $Q_{rr}$ (as shown by a second dashed line 56 in FIG. 2($b$)).

Such operation, if left un-checked, gives rise to a voltage offset ΔV between the voltage across the first main thyristor 18 and the voltage across the second main thyristor 56, where the voltage offset ΔV is given by:

$$\Delta V = \Delta Q_{rr}/C_d$$

where
$\Delta Q_{rr}$ is the difference in charge stored by the second main thyristor 56 and the first main thyristor 18, and
$C_d$ is the value of the damping capacitor 50.

Such a voltage offset can persist for a long time such that it does not decay significantly before the first main thyristor 18 is turned on again approximately 240 electrical degrees later. Such a voltage offset can also significantly affect the timing point at which the voltage across a given main thyristor 18, 56 crosses zero. This impacts on the accuracy of an extinction angle that must be established, e.g. when the main thyristors 18, 56 form part of a HVDC power converter which is operating as an inverter and requires that the extinction angle includes a margin to accommodate such variations in stored charge.

However, in the case of the first semiconductor switching string 100 of the invention, each control unit 30 is configured to switch on the corresponding auxiliary semiconductor switching element 28, i.e. the corresponding transistor 34, while the corresponding first main thyristor 18 is in the aforementioned reverse-biased condition and while a reverse current I is flowing through the said first main thyristor 18, to create the corresponding alternative current path 32 and thereby divert the reverse current through the corresponding alternative current path 32. Such diversion of the reverse current through the corresponding alternative current path 32 prevents this current flowing into the associated damping circuit which has the effect of inhibiting the build up of voltage across the first main thyristor 18 (and so is equivalent to reducing the effective off-state impedance of the corresponding first main thyristor 18) such that the resulting voltage across the corresponding first main thyristor 18 is reduced.

More particularly, each control unit 30 is configured to control the amount of current directed to flow through the corresponding alternative current path 32 by switching the corresponding transistor 34 on and off within a particular switching operation $s_1$, $s_2$, $s_3$, $s_4$, 55, and to carry out such a switching operation $s_1$, $s_2$, $s_3$, $s_4$, $s_5$ five times during a given operating cycle of the semiconductor switching string 100, i.e. while each main semiconductor switching element 12, i.e. the main thyristors 18, 56, is in the reverse-biased condition. As shown in FIG. 2($a$), the ratio of time for which the transistor 34 is on (shown as shaded in FIG. 2($a$)) and off within each switching operation $s_1$, $s_2$, $s_3$, $s_4$, $s_5$ is different in each switching operation $s_1$, $s_2$, $s_3$, $s_4$, $s_5$ so as to adapt the switching of the transistor 34 to the changing difference in the voltage across the first and second main thyristors 18, 56. In other embodiments of the invention (not shown) more than or fewer than five switching operations may be included in a given operating cycle of the semiconductor switching string 100, and the on/off ratio during each such switching operation may further differ from those shown in FIG. 2($a$).

In addition each control unit 30 is also configured to switch on the corresponding transistor 34 when the voltage across the corresponding first main thyristor 18 differs from a voltage reference derived from the voltage across all of the main semiconductor switching elements 12 in the string 100.

In the first embodiment of semiconductor switching string 100 the voltage reference is equivalent to the average voltage across all of the main semiconductor switching elements 12 in the string 100, i.e. the average voltage across the first and second main thyristors 18, 56 shown and all of the remaining main thyristors (not shown). Such an average voltage could be established by a high bandwidth voltage divider across series-connected first and second main thyristors 18, 56, or by having each main thyristor 18, 56 report its own voltage back to its corresponding control unit 30 (or another, overarching control system or higher level controller) and for one of the control units 30 (or the overarching control system) to compute the average voltage (and, in the case of an overarching control system, have that system re-transmit a signal representing the said computed average voltage to each of the control units 30).

Figure 1B:
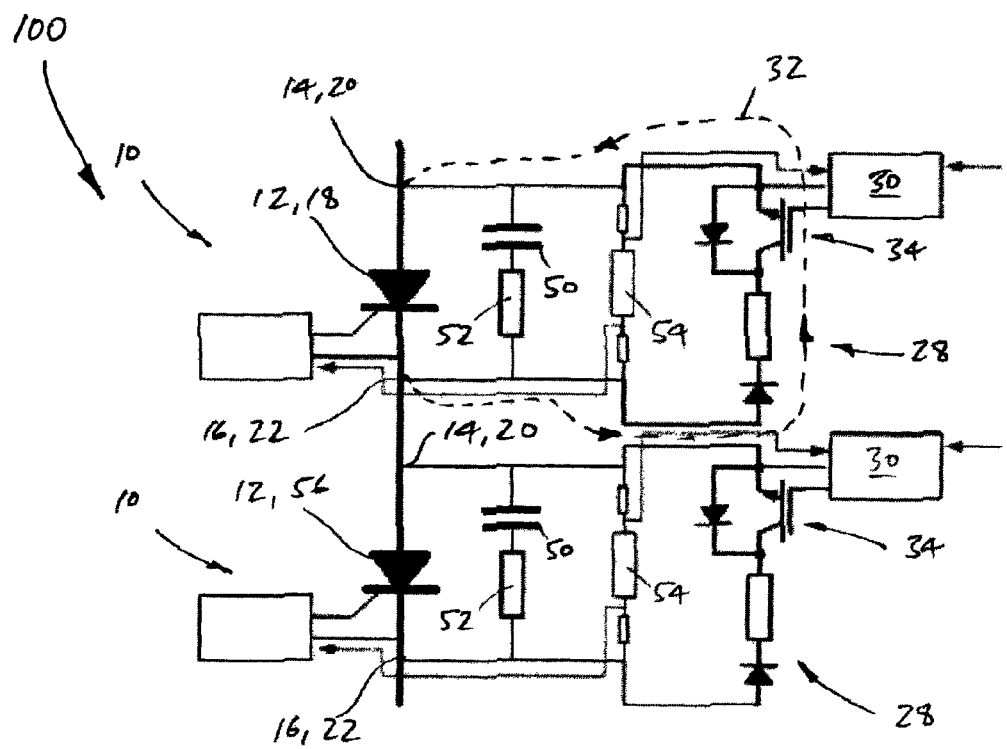
FIG. 1(b) shows a schematic view of two of the first semiconductor switching assemblies shown in FIG. 1(a) connected in series with one another to form a portion of the semiconductor switching string according to the first embodiment of the invention.

By way of example, with reference to the portion of the first semiconductor switching string 100 shown in FIG. 1(b), the control unit 30 of the first semiconductor switching assembly 10 compares the voltage across the first main thyristor 18 with the average voltage and, when the voltage across the first main thyristor 18 is higher than the average voltage, the control unit 30 switches the transistor 34 of the inverse-parallel connected auxiliary semiconductor switching element 28 on and off during the five switching operations $s_1$, $s_2$, $s_3$, $s_4$, $s_5$ so as to selectively direct current through the alternative current path 32 and thereby selectively inhibit the build up of voltage across the first main thyristor 18. Such switching has the effect of passing an amount of charge between the first and second terminals 14, 16 of the first main thyristor 18 which is equal to the difference in the $Q_{rr}$ of the first main thyristor 18 and the $Q_{rr}$ of the second main thyristor 56.

As indicated, this has the effect of reducing the voltage across the first main thyristor 18 (as illustrated by a first non-dashed line 18' in FIG. 2(a)) while increasing the voltage across the second main thyristor 56, which was below the average voltage (as illustrated by a second non-dashed line 56' in FIG. 2(a)). This has the net effect that the voltage across both main thyristors 18, 56 is brought closer to the average voltage, i.e. the voltage across both main thyristors 18, 56 approaches the voltage reference, such that following a number of switching operations, e.g. five in the illustrated example, the variation in the voltage across the main thyristors 18, 56 (and hence the variation in $Q_{rr}$ between the main thyristors 18, 56 arising from their differing turn-off performance characteristics) is compensated for and cancelled out.

Such compensation for the variation in $Q_{rr}$ between the main thyristors 18, 56 has the additional benefit of reducing by between 70% and 90% the required capacitance $C_d$ of the damping capacitor 50 and the power rating of the damping resistor 52.

In other embodiments of the invention (not shown) the or each control unit 30 may instead utilise known or measured characteristics of the corresponding main semiconductor switching element 12 to formulate a switching regime for the corresponding inverse-parallel connected auxiliary semiconductor switching element 28. Such a switching regime may be adapted to the said characteristics of the main semiconductor switching element 12, e.g. the or each control unit 30 'learns' the behaviour of the corresponding main semiconductor switching element 12 and modifies the switching of the corresponding inverse-parallel connected auxiliary semiconductor switching element 28 accordingly.

In the foregoing manner, within the semiconductor switching string 100 of series-connected first semiconductor switching assemblies 10, each control unit 30 (or a single control unit operatively connected to the inverse-parallel connected auxiliary semiconductor switching element 28 of each main thyristor 18, if so configured) compares the voltage across its corresponding main thyristor 18 with the voltage reference.

Those main thyristors 18 whose voltage is above the voltage reference then have their inverse-parallel connected auxiliary semiconductor switching element 28 switched on and off by the corresponding control unit 30 to selectively divert current through the corresponding alternative current path 32 in order to reduce the voltage across each of the said above-average voltage main thyristors 18, so as to bring the voltage of these main thyristors 18 closer to the voltage reference. This has the effect of increasing the average voltage of the remaining below-average voltage main thyristors until eventually, i.e. after a number of similar switching operations, all the main thyristors except the one with the longest turn-off time (i.e. the largest $Q_{rr}$) have had their respective turn-off time discrepancies (i.e. their respective $Q_{rr}$ discrepancies) compensated for.

Figure 3:
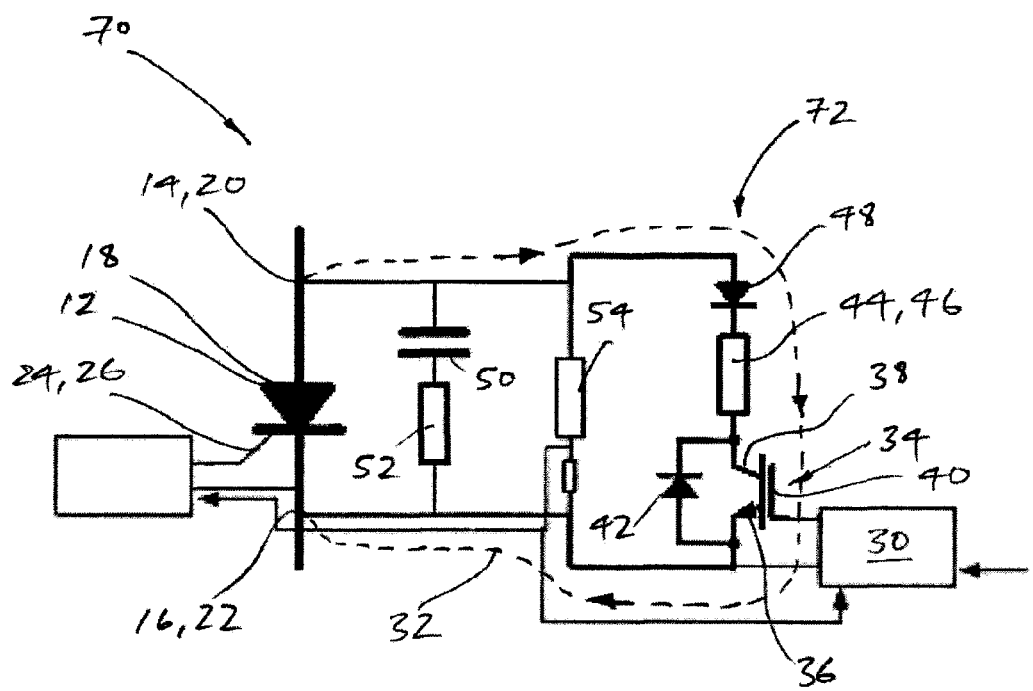
FIG. 3 shows a schematic view of a second semiconductor switching assembly which forms a part of a semiconductor switching string according to a second embodiment of the invention.

A second semiconductor switching assembly, which is one of a plurality of series-connected such semiconductor switching assemblies that together form a semiconductor switching string according to a second embodiment of the invention, is shown in FIG. 3 and is designated generally by reference numeral 70.

The second semiconductor switching assembly 70 is similar to the first semiconductor switching assembly 10 and like features share the same reference numerals.

However, the second semiconductor switching assembly 70 differs from the first semiconductor switching assembly 10 in that it includes an auxiliary semiconductor switching element 72 that is connected in parallel with the main semiconductor switching element 12, i.e. the main thyristor 18, such that when the parallel connected auxiliary semiconductor switching element 72 is switched on the resulting alternative current path 32 allows current to flow from the first connection terminal 14 to the second connection terminal 16 of the main thyristor 18.

A further difference is that in the second semiconductor switching assembly 70 the control unit 30 is configured to switch on the parallel connected auxiliary semiconductor switching element 72 while the main thyristor 18 is in a forward-biased condition, i.e. when the main thyristor 18 is switched off but experiences a positive voltage between its first and second connection terminals 14, 16 such that it will allow current to flow through the main thyristor 18 in a normal manner from the anode 20 to the cathode 22 on receipt of a turn-on signal from the control unit 30.

The parallel connected auxiliary semiconductor switching element 72 similarly includes a transistor 34 but, because of the parallel manner in which the auxiliary semiconductor switching element 72 is electrically connected with the main thyristor 18, the emitter 36 of the transistor 34 is instead connected to the second connection terminal 16 of the main thyristor 18 and the collector 38 of the transistor 34 is instead connected to the first connection terminal 14 of the main thyristor 18. The base 40 of the transistor 34 is again connected to the control unit 30.

The transistor 34 in the parallel connected auxiliary semiconductor switching element 72 has the same ratings as the transistor 34 in the inverse-parallel connected auxiliary semiconductor switching element 28 of the first semiconductor switching assembly 10, i.e. a relatively high voltage rating of approximately 9 kV to 10 kV and a relatively low current rating of only a few tens of amps.

The second semiconductor switching assembly 70 may be operated in essentially the same manner as the first semiconductor switching assembly 10 in order to selectively divert current through the alternative current path 32 (to reduce the effective impedance of the main thyristor 18 and thereby reduce the voltage across the main thyristor 18) while the main thyristor 18 is in a forward-biased condition. In other words, the control unit 30 of the second semiconductor switching assembly 70 is configured to switch the parallel connected auxiliary semiconductor switching element 72 on and off within a plurality of switching operations to control the amount of current diverted to flow through the alternative current path 32 (and hence to control the amount of charge passed between the first and second terminals 14, 16 of the main thyristor 18) so that the voltage across the main thyristor 18 approaches a voltage reference.

As such the semiconductor switching string according to a second embodiment of the invention, i.e. including a plurality of series-connection second semiconductor switching assemblies 70, is operable in a similar manner to the first semiconductor switching string 100 to permit grading, i.e. balancing, of the voltage across the plurality of respective main semiconductor switching elements 12 while each such main semiconductor switching element 12 is in a forward-biased condition.

A still further semiconductor switching string according to a third embodiment of the invention (not shown) includes a plurality of series-connected third semiconductor switching assemblies, each of which includes both an inverse-parallel connected auxiliary semiconductor switching element 28 (as per the first semiconductor switching assembly 10) and a parallel connected auxiliary semiconductor switching element 72 (as per the second semiconductor switching assembly 70).

In this regard, despite the use of a control unit 30 to switch the inverse-parallel connected auxiliary semiconductor switching element 28 on and off while the main thyristor 18 is in a reverse-biased condition in order to compensate for any variation in $Q_{rr}$ between respective main thyristors 18, 56 (and the voltage imbalance across the main thyristors 18, 56 that would otherwise arise), residual voltage unbalancing effects may arise while the main thyristor 18 remains switched off but is forward biased, i.e. during the period of delay between the main thyristor 18 being switched on and it becoming fully turned on, i.e. during turn on of the main thyristor 18.

Such residual voltage unbalancing effects may, for example, arise because of one or more unintended variations in the level of reverse current diverted through a respective alternative current path 32 provided by the corresponding inverse-parallel connected auxiliary semiconductor switching element 28 when reducing the voltage across the corresponding main thyristor 18 while it is reverse-biased.

In addition, in instances when the main thyristor 18 is self-commutated, voltage imbalances can arise at turn-off of such main thyristors 18 because of differences between respective main thyristors 18 in the time taken for the forward current after turn-off to decay to zero, which is essentially equivalent to dissipating a given amount of stored charge.

The third semiconductor switching assembly, and its inclusion of both inverse-parallel and parallel connected auxiliary semiconductor switching elements 28, 72, is able to compensate for any variation in $Q_{rr}$ between respective main thyristors 18, 56 (and achieve a balance in the voltage across the respective main thyristors 18, 56) when the main thyristors 18, 56 are both reverse-biased and forward-biased. As such the third semiconductor switching assembly permits a complete omission of the damping circuit, i.e. the damping capacitor 50 and the damping resistor 52, while still permitting the third semiconductor switching string of which it forms a part to carry out voltage grading in respect of each of the main semiconductor switching elements 12 therein.

Figure 4:
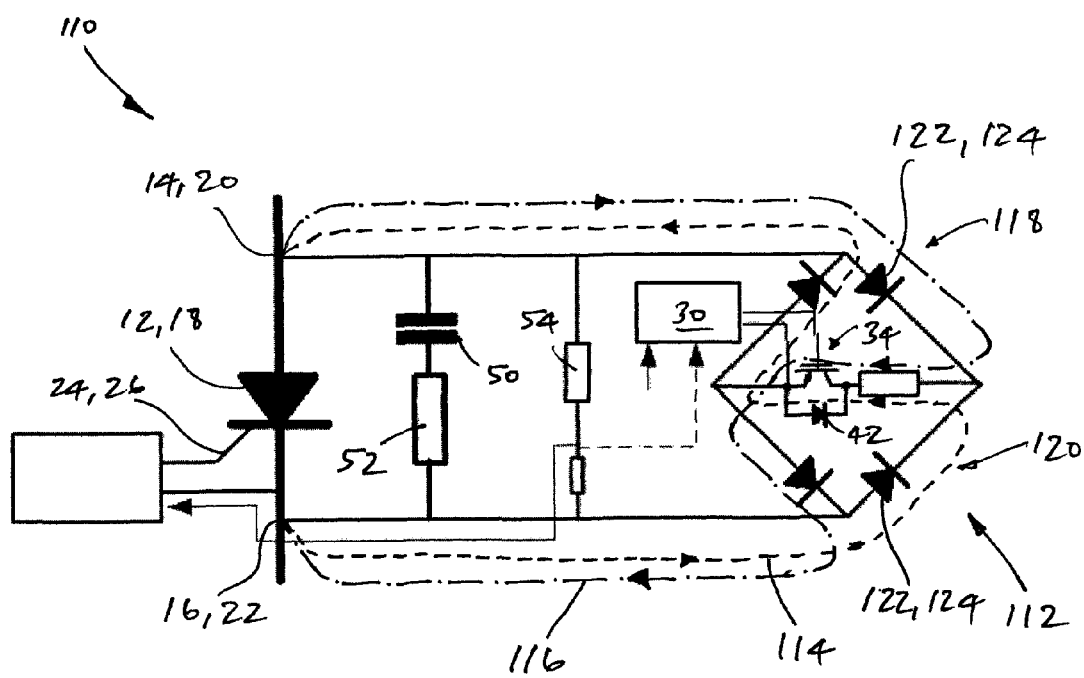
FIG. 4 shows a schematic view of a fourth semiconductor switching assembly which forms a part of a semiconductor switching string according to a fourth embodiment of the invention.

A fourth semiconductor switching assembly, which is one of a plurality of series-connected such semiconductor switching assemblies that together form a semiconductor switching string according to a fourth embodiment of the invention, is shown in FIG. 4 and is designated generally by reference numeral 110.

The fourth semiconductor switching assembly 110 has similarities with each of the first, second and third semiconductor switching assemblies 10; 70 and like features share the same reference numerals.

The fourth semiconductor switching assembly 110 is, however, different from each of the aforementioned semiconductor switching assemblies 10; 70 in that it includes an auxiliary semiconductor switching element 112 that is selectively connectable in both inverse-parallel and parallel with a corresponding main semiconductor switching element 12 such that the auxiliary semiconductor switching element 112 has bidirectional functionality. In this regard, when the bidirectional auxiliary semiconductor switching element 112 is connected in inverse-parallel with the main semiconductor switching element 112 (and switched on) a first alternative current flow path 114 allows current to flow from the second connection terminal 16 to the first connection terminal 14 of the main semiconductor switching element 12. Meanwhile, when the bidirectional auxiliary semiconductor switching element 112 is connected in parallel with the main semiconductor switching element 112 (and switched on) a second alternative current flow path 116 allows current to flow from the first connection terminal 14 to the second connection terminal 16 of the main semiconductor switching element 12.

More particularly, such bidirectional functionality is provided by connecting the bidirectional auxiliary semiconductor switching element 112 with first and second pairs 118, 120 of passive current check elements 122, i.e. devices which allow current to flow in one direction only which in the embodiment shown are diodes 124, in a full bridge arrangement between the first and second connection terminals 14, 16 of the main semiconductor switching element 12.

The fourth semiconductor switching assembly 110 operates in a similar manner to the third semiconductor switching assembly, in that its inclusion of a bidirectional auxiliary semiconductor switching element 112 which is selectively connectable in either inverse-parallel or parallel with the main semiconductor switching element 12 allows it to compensate for any variation in $Q_{rr}$ between its main semiconductor switching element 12, i.e. main thyristor 18, and the other main semiconductor switching elements 12 in the fourth semiconductor switching string of which it forms a part (and thereby grade the voltage across the said various main semiconductor switching elements 12 in the fourth string) when the main semiconductor switching elements 12 are either reverse-biased or forward-biased.

As such the fourth semiconductor switching assembly 110 permits a complete omission of the damping circuit, i.e. the damping capacitor 50 and the damping resistor 52, while still permitting the fourth semiconductor switching string of which it forms a part to carry out the aforementioned voltage grading in respect of each of the main semiconductor switching elements 12 therein.

In addition to the foregoing, a semiconductor switching string (not shown) according to a further embodiment of the invention may include a plurality of series-connected semiconductor switching assemblies made up of any combination of the first, second, third or fourth semiconductor switching assemblies 10; 70; 110; described hereinabove.

The invention claimed is:

1. A semiconductor switching string, for use in a HVDC power converter, comprising:
   a plurality of series-connected semiconductor switching assemblies, each semiconductor switching assembly having a main semiconductor switching element including first and second connection terminals between which current flows from the first terminal to the second terminal when the main semiconductor switching element is switched on, the main semiconductor switching element having an auxiliary semiconductor switching element electrically connected between the first and second connection terminals thereof; and
   a control unit operatively connected with each auxiliary semiconductor switching element, the or each control unit being configured to switch on a respective auxiliary semiconductor switching element to selectively create an alternative current path between the first and second connection terminals associated therewith whereby current is diverted to flow through the alternative current path to reduce the voltage across the corresponding main semiconductor switching element, the or each control unit being further configured to switch on the said respective auxiliary semiconductor switching element when the voltage across the corresponding main semiconductor switching element differs from a real-time varying voltage reference equivalent to the average voltage across all of the main semiconductor switching elements in the semiconductor switching string, and the or each control unit being still further configured to control the amount of current diverted to flow through a respective alternative current path so that the voltage across the corresponding main semiconductor switching element approaches the real-time varying voltage reference.

2. A semiconductor switching string according to claim 1 wherein the or each control unit is configured to switch on a said respective auxiliary semiconductor switching element when the voltage across the corresponding main semiconductor switching element is greater than the voltage reference.

3. A semiconductor switching string according to claim 1 wherein the or each control unit is configured to control the amount of current diverted to flow through a respective alternative current path by selectively switching the corresponding auxiliary semiconductor switching element on and off.

4. A semiconductor switching string according to claim 3 wherein the or each control unit is further configured to switch the said corresponding auxiliary semiconductor switching element on and off within a switching operation a plurality of times in an operating cycle of the semiconductor switching string.

5. A semiconductor switching string according to claim 3 wherein the ratio of time for which a said corresponding auxiliary semiconductor switching element is on and off within a switching operation differs during the operating cycle.

6. A semiconductor switching string according to claim 1 wherein each semiconductor switching assembly includes an auxiliary semiconductor switching element connected in inverse-parallel with the corresponding main semiconductor switching element whereby when the inverse-parallel connected auxiliary semiconductor switching element is switched on the alternative current path is configured to allow current to flow from the second connection terminal to the first connection terminal of the corresponding main semiconductor switching element, and wherein the corresponding control unit is configured to switch on a respective inverse-parallel connected auxiliary semiconductor switching element while the corresponding main semiconductor switching element is in a reverse-biased condition to divert current to flow through the so-configured alternative current path to reduce the voltage across the corresponding main semiconductor switching element.

7. A semiconductor switching string according to claim 6 wherein each inverse-parallel connected auxiliary semiconductor switching element is or includes a transistor having an emitter connected to the first connection terminal of the corresponding main semiconductor switching element, a collector connected to the second connection terminal of the corresponding main semiconductor switching element, and a base connected to the corresponding control unit.

8. A semiconductor switching string according to claim 1 wherein each semiconductor switching assembly includes an auxiliary semiconductor switching element connected in parallel with the corresponding main semiconductor switching element whereby when the parallel connected auxiliary semiconductor switching element is switched on the alternative current path is configured to allow current to flow from the first connection terminal to the second connection terminal of the corresponding main semiconductor switching element, and wherein the corresponding control unit is configured to switch on a respective parallel connected auxiliary semiconductor switching element while the corresponding main semiconductor switching element is in a forward-biased condition to divert current to flow through the so-configured alternative current path.

9. A semiconductor switching string according to claim 8 wherein each parallel connected auxiliary semiconductor switching element is or includes a transistor having an emitter connected to the second connection terminal of the corresponding main semiconductor switching element, a collector connected to the first connection terminal of the corresponding main semiconductor switching element, and a base connected to the corresponding control unit.

10. A semiconductor switching string according to claims 1 wherein each semiconductor switching assembly includes a first auxiliary semiconductor switching element connected in inverse-parallel with the corresponding main semiconductor switching element and a second auxiliary semiconductor switching element connected in parallel with the corresponding main semiconductor switching element.

11. A semiconductor switching string according to claim 1 wherein each semiconductor switching assembly includes an auxiliary semiconductor switching element selectively connectable in inverse-parallel and in parallel with the corresponding main semiconductor switching element whereby when the auxiliary semiconductor switching element is connected in inverse-parallel and switched on a first alternative current path allows current to flow from the second connection terminal to the first connection terminal of the corresponding main semiconductor switching element, and whereby when the auxiliary semiconductor switching element is connected in parallel and switched on a second alternative current path allows current to flow from the first connection terminal to the second connection terminal of the corresponding main semiconductor switching element.

12. A semiconductor switching string according to claim 11 wherein each auxiliary semiconductor switching element is connected with first and second pairs of passive current check elements in a full bridge arrangement between the first and second connection terminals of the corresponding main semiconductor switching element.

* * * * *